(12) United States Patent
Chen et al.

(10) Patent No.: US 11,876,024 B2
(45) Date of Patent: Jan. 16, 2024

(54) METHOD FOR OPERATING A BENCHMARK DEVICE ON A SEMICONDUCTOR WAFER WITH FUSE ELEMENT

(71) Applicant: NANYA TECHNOLOGY CORPORATION, New Taipei (TW)

(72) Inventors: Yi-Ju Chen, Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 120 days.

(21) Appl. No.: 17/497,744

(22) Filed: Oct. 8, 2021

(65) Prior Publication Data

US 2023/0116846 A1 Apr. 13, 2023

(51) Int. Cl.
*H01L 27/02* (2006.01)
*H01L 23/62* (2006.01)
*H01L 21/66* (2006.01)
*H01L 23/525* (2006.01)

(52) U.S. Cl.
CPC .......... *H01L 22/14* (2013.01); *H01L 23/5256* (2013.01); *H01L 23/62* (2013.01); *H01L 27/0292* (2013.01); *H01L 27/0255* (2013.01)

(58) Field of Classification Search
CPC . H01L 22/14; H01L 23/5256; H01L 27/0292; H01L 27/0255; H01L 23/62
See application file for complete search history.

(56) References Cited

U.S. PATENT DOCUMENTS

| 5,393,701 | A | * | 2/1995 | Ko | H01L 24/05 438/599 |
| 5,691,234 | A | * | 11/1997 | Su | H01L 27/0255 438/719 |
| 5,702,566 | A | * | 12/1997 | Tsui | H01L 21/32136 216/41 |
| 6,566,716 | B2 | * | 5/2003 | Lin | H01L 23/52 257/E23.141 |
| 6,809,582 | B2 | * | 10/2004 | Morimoto | H01L 27/0255 327/563 |
| 7,368,768 | B2 | * | 5/2008 | Hayashida | H01L 27/0255 257/209 |

(Continued)

FOREIGN PATENT DOCUMENTS

| CN | 101651132 A | 2/2010 |
| CN | 205229404 U | 5/2016 |

(Continued)

OTHER PUBLICATIONS

Office Action dated Nov. 7, 2022 related to Taiwanese Application No. 110149426.

*Primary Examiner* — Eduardo A Rodela
(74) *Attorney, Agent, or Firm* — Xuan Zhang

(57) ABSTRACT

The present disclosure provides a method of operating a benchmark device embedded on a semiconductor wafer. The method includes applying a first voltage to a first electrode of the benchmark device, and applying a second voltage to a second electrode of the benchmark device. The method further includes electrically isolating a first component of the benchmark device from a second component of the benchmark device through a disconnecting switch connected between the first component and the second component.

7 Claims, 10 Drawing Sheets

(56) References Cited

U.S. PATENT DOCUMENTS

| | | | |
|---|---|---|---|
| 8,803,238 B2 * | 8/2014 | Kim | H01L 29/0692 |
| | | | 257/E23.002 |
| 8,952,486 B2 * | 2/2015 | Yang | H01L 23/5256 |
| | | | 257/E23.149 |
| 10,181,713 B2 * | 1/2019 | Bousquet | H01L 27/0255 |
| 10,249,621 B2 * | 4/2019 | Visokay | H01L 21/31116 |
| 11,121,083 B2 * | 9/2021 | Huang | G01R 31/74 |
| 11,557,360 B1 * | 1/2023 | Lin | G11C 29/50 |
| 2016/0025805 A1 | 1/2016 | Uppal et al. | |
| 2019/0074257 A1 * | 3/2019 | Pritchard | H01L 22/34 |
| 2019/0267207 A1 * | 8/2019 | Jaster | H01H 85/47 |

FOREIGN PATENT DOCUMENTS

| | | |
|---|---|---|
| CN | 106646179 A | 5/2017 |
| CN | 110783313 A | 2/2020 |
| CN | 113224035 A | 8/2021 |
| CN | 113471174 A | 10/2021 |

* cited by examiner

METHOD FOR OPERATING A BENCHMARK DEVICE ON A SEMICONDUCTOR WAFER WITH FUSE ELEMENT

TECHNICAL FIELD

The present disclosure relates to a method for operating a benchmark device, and more particularly, to a method for operating a benchmark device on a semiconductor wafer having a fuse element.

DISCUSSION OF THE BACKGROUND

The antenna effect, more formally plasma induced gate oxide damage, as seen during manufacture of semiconductor devices, can potentially cause yield and reliability problems. Antenna effect in the manufacture of semiconductor devices affects charge collection, with a significant charge frequently induced during plasma etching and other processes. For conducting material or wiring that will be connected to the gate of a transistor, the wiring acts as an antenna, inducing a significant charge, and diodes formed by drain and source diffusion layers can conduct significant current. Antenna effect can eventually cause gate breakdown or decrease I-V characteristics, and adversely affect performance of a semiconductor device.

One existing solution is connection of a diode (usually referred to as an antenna diode) to the wiring, creating a route for discharge during etching. While an antenna diode is useful to protect the semiconductor device during manufacture, it nevertheless disturbs the measurements that need to be conducted after manufacture is complete.

For example, in MOSFET measurement such as gate-induced drain leakage (GIDL), body effect will be disturbed by the antenna diode, because the gate/body voltage of the MOSFET device will drop when the antenna diode is turned on. Focused ion beam (FIB) is one technique to remove the antenna diode after manufacture. However, this approach may cause undesired damages to the semiconductor device if the FIB system is not well-controlled.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor wafer comprising a benchmark device disposed within a scribe line of the semiconductor wafer. The benchmark device includes a transistor, a diode, and a disconnecting switch electrically connected to the transistor and the diode. The disconnecting switch is configured to form a conductive path between the transistor and the diode at a first stage, and to electrically isolate the transistor from the diode at a second stage.

Another aspect of the present disclosure provides a benchmark device embedded on a semiconductor wafer. The benchmark device includes a transistor comprising a gate electrode, a diode comprising a cathode electrode, and a disconnecting switch electrically connected between the gate electrode of the transistor and the cathode electrode of the diode. The disconnecting switch is configured to electrically disconnect the gate electrode of the transistor from the cathode electrode of the diode in response to a current exceeding a predetermined value through the disconnecting switch.

Another aspect of the present disclosure provides a method of method of operating a benchmark device embedded on a semiconductor wafer. The method includes applying a first voltage to a first electrode of the benchmark device. The method includes applying a second voltage to a second electrode of the benchmark device. The method further includes electrically isolating a first component of the benchmark device from a second component of the benchmark device through a disconnecting switch connected between the first component and the second component.

The disconnecting switch disclosed in the present disclosure can be configured to disconnect a specific component (e.g., the antenna diode) from the benchmark device after the manufacture of a semiconductor device is complete. The disconnecting switch disclosed in the present disclosure can facilitate the measurements on the benchmark device by eliminating the interference introduced by a specific component (e.g., the antenna diode). Furthermore, with the disconnecting switch disclosed in the present disclosure, unwanted damages to the semiconductor device caused by FIB (focused ion beam) can be prevented.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
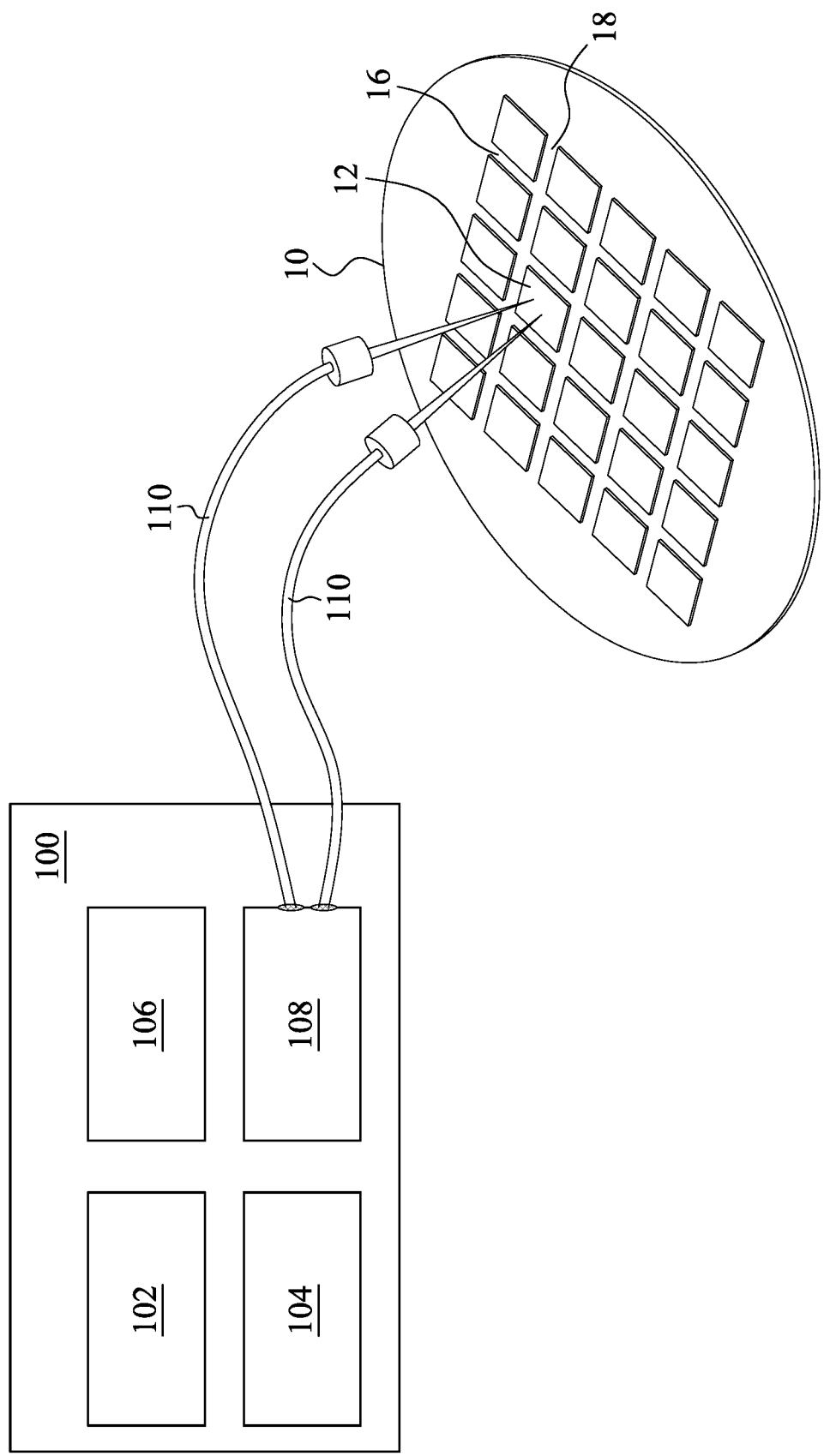
FIG. 1A is a schematic view of a system for testing/measuring a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A illustrates a schematic view of a system for testing/measuring a semiconductor device, in accordance with some embodiments of the present disclosure. FIG. 1A shows a system 100 for testing/measuring a semiconductor device. FIG. 1A also shows a semiconductor wafer 10 on which a semiconductor die to be tested/measured can be included.

The semiconductor wafer 10 can comprise an elementary semiconductor such as silicon, germanium, or diamond. The semiconductor wafer 10 may include one or more dies 12 formed thereon. A plurality of scribe lines 16 and 18 can be provided between adjacent dies 12 so that dies 12 can be separated/singulated in subsequent processing. In some embodiments, the dies 12 can be integrated circuits (ICs) or chips. The semiconductor wafer 10 may include a plurality of dies 12 and several process control monitoring (PCM) devices (not shown in FIG. 1A). A PCM device can be regarded as a benchmark device that can be utilized to evaluate the characteristics/performance of the dies 12.

A PCM device may include one or more basic components that are utilized to constitute the circuits within the dies 12. Therefore, the characteristics/performance of the circuits within the dies 12 can be evaluated after the characteristics/performance of the one or more basic components are obtained. The PCM devices can be used to monitor the characteristics of the dies 12 during a wafer acceptance test (WAT). The PCM device can be formed in a scribe line, a street, or other locations not occupied by the circuits within the dies 12 on the wafer 10.

Referring to FIG. 1A, the system 100 can be test/measurement equipment. The system 100 may include hardware and software components that provide a suitable operational and/or functional environment for the dies 12 to be tested. In some embodiments, the system 100 may include a processor 102, a signal generator 104, a monitor 106, and a coupler 108.

Signals/commands can be transmitted between each of the processor 102, the signal generator 104, the monitor 106, and the coupler 108. In some embodiments, the signals transmitted within the system 100 can include power signals having adjustable voltage levels.

In various embodiments, the processor 102 may include, but is not limited to, at least one hardware processor, including at least one microprocessor such as a CPU, a portion of at least one hardware processor, or any other suitable dedicated processor such as those developed based on Field Programmable Gate Array (FPGA) and Application Specific Integrated Circuit (ASIC).

The signal generator 104 is configured to provide test signals. All types of electrical signals, such as data signals, clock signals, or power signals, can be provided to a PCM device associated with the die 12. In some embodiments, electrical signals can also be provided to the die 12 directly.

The monitor 106 is configured to determine whether the PCM device complies with a test criterion. The signals fed back from the PCM device can be evaluated by the monitor 106, and a determination can be made whether the PCM device 12 complies with the test criterion. The monitor 106 can provide/display information and/or instructions to the user. In some embodiments, the monitor 106 can display pop-up notifications. In some embodiments, the monitor 106 can provide alarm messages to the user when the PCM device fails to comply with certain test criteria.

The coupler 108 is configured to couple the signal generator 104 to the PCM device on the wafer 10. In some embodiments, the coupler 108 can be coupled to the PCM device by one or more probes 110. The probes 110 can be part of a probe head or probe package (not shown). The probes 110 can be electrically coupled to test conductive contacts (pads) and/or bonding pads disposed on the PCM devices. The test conductive pads and/or bonding pads provide electrical connections to an interconnect structure (e.g., wiring) of the dies. For example, some of the probes 110 can be coupled to pads that are associated with a supply terminal (e.g., Vdd) and ground terminal (e.g., Vss) of the PCM device. Other probes can be coupled to pads associated with input/output (I/O) terminals (e.g., data signals) of the PCM device. As such, the system 100 is operable to apply electrical signals to the PCM device and obtain response/feedback signals from the PCM device during WAT.

Figure 1B:
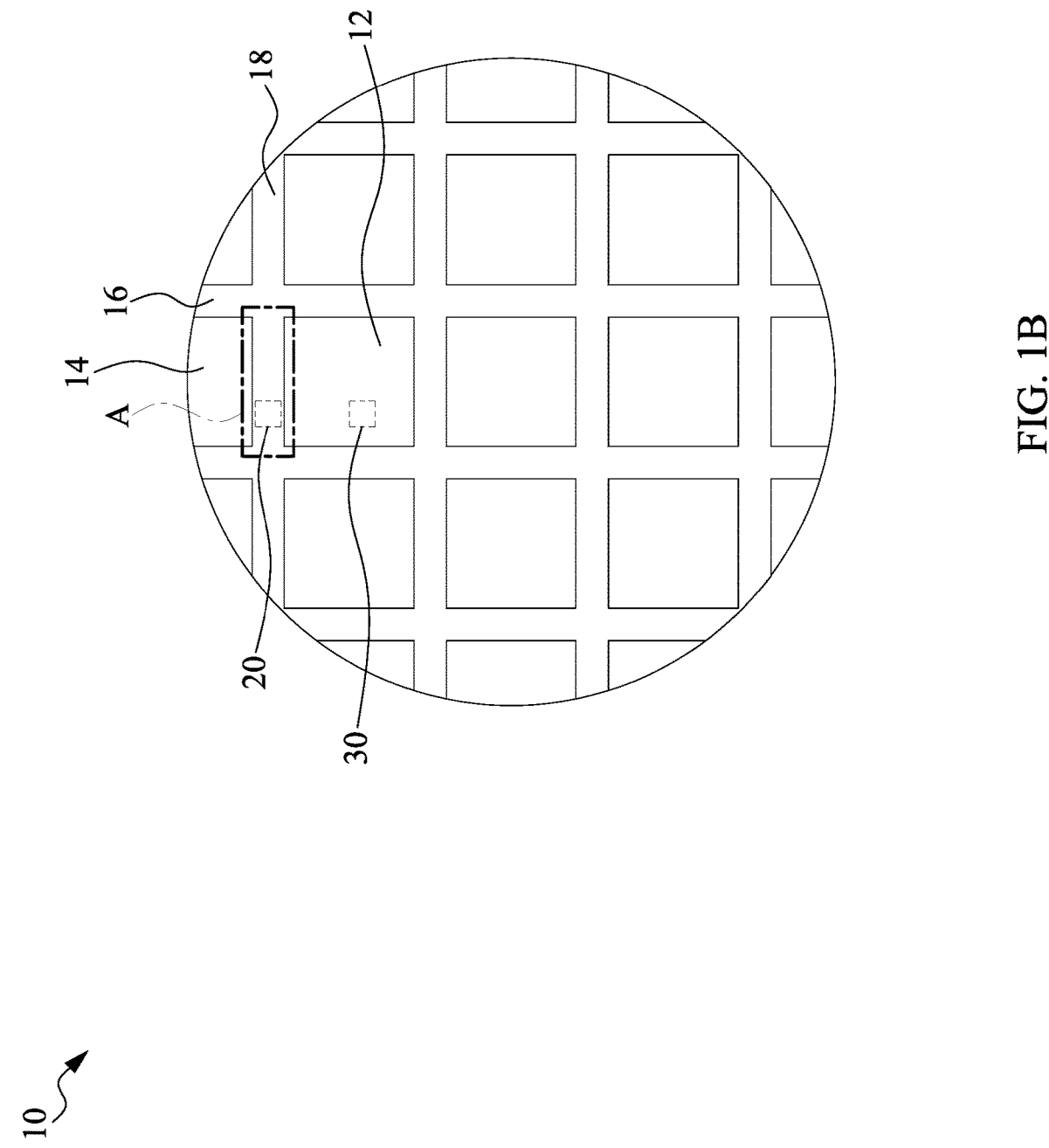
FIG. 1B is a top view of an example semiconductor wafer, in accordance with some embodiments of the present disclosure.

FIG. 1B illustrates a top view of an example semiconductor wafer, in accordance with some embodiments of the present disclosure. FIG. 1B shows a top view of an example semiconductor wafer 10.

Referring to FIG. 1B, the semiconductor wafer 10 may include a plurality of dies (such as dies 12 and 14) arranged in a grid pattern, which includes a plurality of rows and columns of dies. Each column of dies or chips are separated by vertical scribe lines 16, and each row of the dies is separated by horizontal scribe lines 18.

Individual dies 12 and 14 within the semiconductor wafer 10 may contain circuitry. The dies 12 and 14 can be separated by a sawing operation performed through the scribe line (e.g., the horizontal scribe line 18) and then packaged to form individual devices. The dies 12 and 14 on the semiconductor wafer 10 may include several basic circuit components (e.g., basic circuit component 30), which can be interconnected to constitute a semiconductor device having logical or other functions. In some embodiments, the basic circuit components may include active devices such as transistors and passive devices such as resistors, capacitors, inductors, or a combination thereof.

In an exemplary semiconductor fabrication process, each basic circuit component may need to be tested and/or evaluated at selected stages of the fabrication process, so as to assure the device quality. However, an individual basic circuit component (e.g., basic circuit component 30) may not be readily testable once integrated into a circuit. In order to verify that each basic circuit component was fabricated according to design specification and exhibits selected properties or values, the PCM devices (e.g., benchmark device 20) can be used as an applicable quality control methodology.

A PCM device can also be referred to as a benchmark device or a device-under-test (DUT) throughout the present disclosure. Referring to FIG. 1B, the dotted rectangle A can be the location within which PCM devices can be located. The areas containing the PCM devices can be referred to as a PCM test line or abbreviated as a test line throughout the present disclosure.

A PCM device can include various basic circuit components fabricated together with the circuits within the dies 12. Such PCM device (e.g., benchmark device 20) may have properties similar to their counterparts (e.g., basic circuit component 30) in the dies 12, since they are fabricated using the same process. As such, the electrical characteristics (such as but not limited to a test result, response to signal, performance parameter, etc.) of the circuits within the dies 12 can be appropriately evaluated after the electrical characteristics of the PCM device are obtained. Each PCM device can be coupled to the signal generator 104 through one or more conductive pads exposed on the wafer 10.

Figure 2:
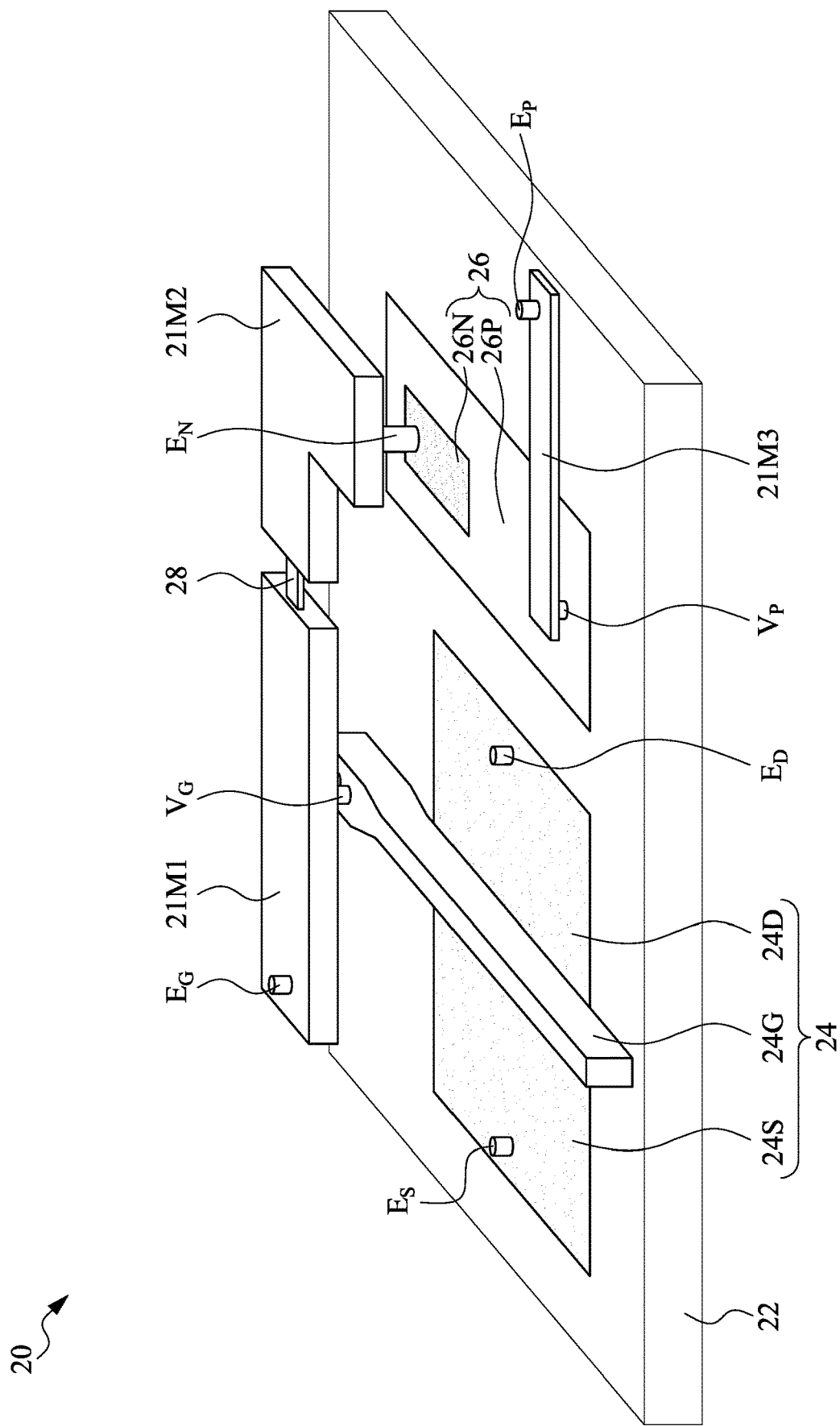
FIG. 2 is a schematic view of a benchmark device, in accordance with some embodiments of the present disclosure.

FIG. 2 is a schematic view of a benchmark device, in accordance with some embodiments of the present disclosure. FIG. 2 shows a benchmark device 20. The benchmark device 20 may also be referred to as a DUT or a PCM device in the present disclosure. The benchmark device 20 includes a substrate 22, a transistor 24, a diode 26, and a disconnecting switch 28.

In some embodiments, the substrate 22 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 22 may include a layered semiconductor such as silicon/silicon germanium, silicon-on-insulator, or silicon germanium-on-insulator.

The transistor 24 is formed on the substrate 22. The transistor 24 can be partially embedded within the substrate 22. The transistor 24 includes a source region 24S, a drain region 24D, and a gate conductor 24G. The source region 24S and the drain region 24D are disposed on opposite sides of the gate conductor 24G. In some embodiments, the source region 24S and the drain region 24D can be active regions with N-type dopants. In other embodiments, the source region 24S and the drain region 24D can be active regions with P-type dopants.

In some embodiments, the source region 24S and the drain region 24D can be doped with an N-type dopant such as phosphorus (P), arsenic (As), or antimony (Sb) for forming an NMOSFET (N-channel metal oxide semiconductor field effect transistor). In some embodiments, the source region 24S and the drain region 24D can be doped with a P-type dopant such as boron (B) or indium (In) for forming a PMOSFET.

The transistor 24 includes a conductive contact $E_S$ disposed on the source region 24S and a conductive contact $E_D$ disposed on the drain region 24D. The conductive contact $E_S$ is electrically connected to the source region 24S and configured to receive and/or provide voltage, current, and/or electrical signals. The conductive contact $E_D$ is electrically connected to the drain region 24D and configured to receive and/or provide voltage, current, and/or electrical signals.

In some embodiments, the conductive contacts $E_D$ and $E_S$ may include doped polysilicon (poly-Si), titanium (Ti), titanium nitride (TiN), tantalum (Ta), tantalum nitride (TaN), tungsten (W), copper (Cu), aluminum (Al) or an alloy thereof.

The gate conductor 24G is disposed between the source region 24S and the drain region 24D. In some embodiments, the gate conductor 24G may include polysilicon, a silicide material, or metal composites, such as WN, TiN, or TaN.

The gate conductor 24G is electrically connected to a conductive structure 21M1 through a conductive contact $V_G$. The conductive structure 21M1 can be a conductive layer, a conductive wire, a conductive plate, or a conductive film. A conductive contact $E_G$ is disposed on the conductive structure 21M1 and configured to receive and/or provide voltage, current, and/or electrical signals.

The diode 26 is formed on the substrate 22. The diode 26 can be partially embedded within the substrate 22. The diode 26 includes doped regions 26P and 26N. The doped regions 26P and 26N include dopants of different types. In some embodiments, the doped region 26P includes a P-type dopant such as boron (B) or indium (In). In some embodiments, the doped region 26N includes an N-type dopant such as phosphorus (P), arsenic (As), or antimony (Sb).

The diode 26 includes a conductive contact $E_N$ disposed on the doped region 26N and a conductive contact $V_P$ disposed on the doped region 26P. The conductive contact $E_N$ is electrically connected to the doped region 26N and configured to receive and/or provide voltage, current, and/or electrical signals. The conductive contact $V_P$ is electrically connected to the doped region 26P and configured to receive and/or provide voltage, current, and/or electrical signals.

The doped region 26N is electrically connected to a conductive structure 21M2 through the conductive contact $E_N$. The doped region 26P is electrically connected to a conductive structure 21M3 through the conductive contact $V_P$. Each of the conductive structures 21M2 and 21M3 can be a conductive layer, a conductive wire, a conductive plate, or a conductive film.

The conductive contact $E_N$ can be referred to as a cathode of the diode 26. The conductive contact $E_P$ disposed on the conductive structure 21M3 can be referred to as an anode of the diode 26.

Referring to FIG. 2, the disconnecting switch 28 is disposed between the conductive structures 21M1 and 21M2. The disconnecting switch 28 is electrically connected to the conductive structure 21M1. The disconnecting switch 28 is electrically connected to the conductive structure 21M2. In some embodiments, the disconnecting switch 28 can have dimensions different from those of the conductive structures 21M1 and 21M2. In other embodiments, the disconnecting switch 28 can have dimensions similar to those of the conductive structures 21M1 and 21M2.

The disconnecting switch 28 can include a fuse element having a melting point different than those of the conductive structures 21M1 and 21M2. In some embodiments, the disconnecting switch 28 can include a fuse element having a relatively low melting point. When a current through the disconnecting switch 28 exceeds the breaking capacity (e.g., a predetermined value of current) of the disconnecting switch 28, the fuse element of the disconnecting switch 28 melts and an open circuit is formed between the conductive structures 21M1 and 21M2. In other words, the transistor 24 can be electrically isolated from the diode 26 after the fuse element of the disconnecting switch 28 melts.

The breaking capacity is the maximum current that can safely be interrupted by the disconnecting switch 28. The disconnecting switch 28 can be made of zinc, copper, silver, aluminum or alloys of those or other various metals to provide stable and predictable characteristics. In some embodiments, the breaking capacity of the disconnecting switch 28 can be adjusted in accordance with design needs.

Figure 3:
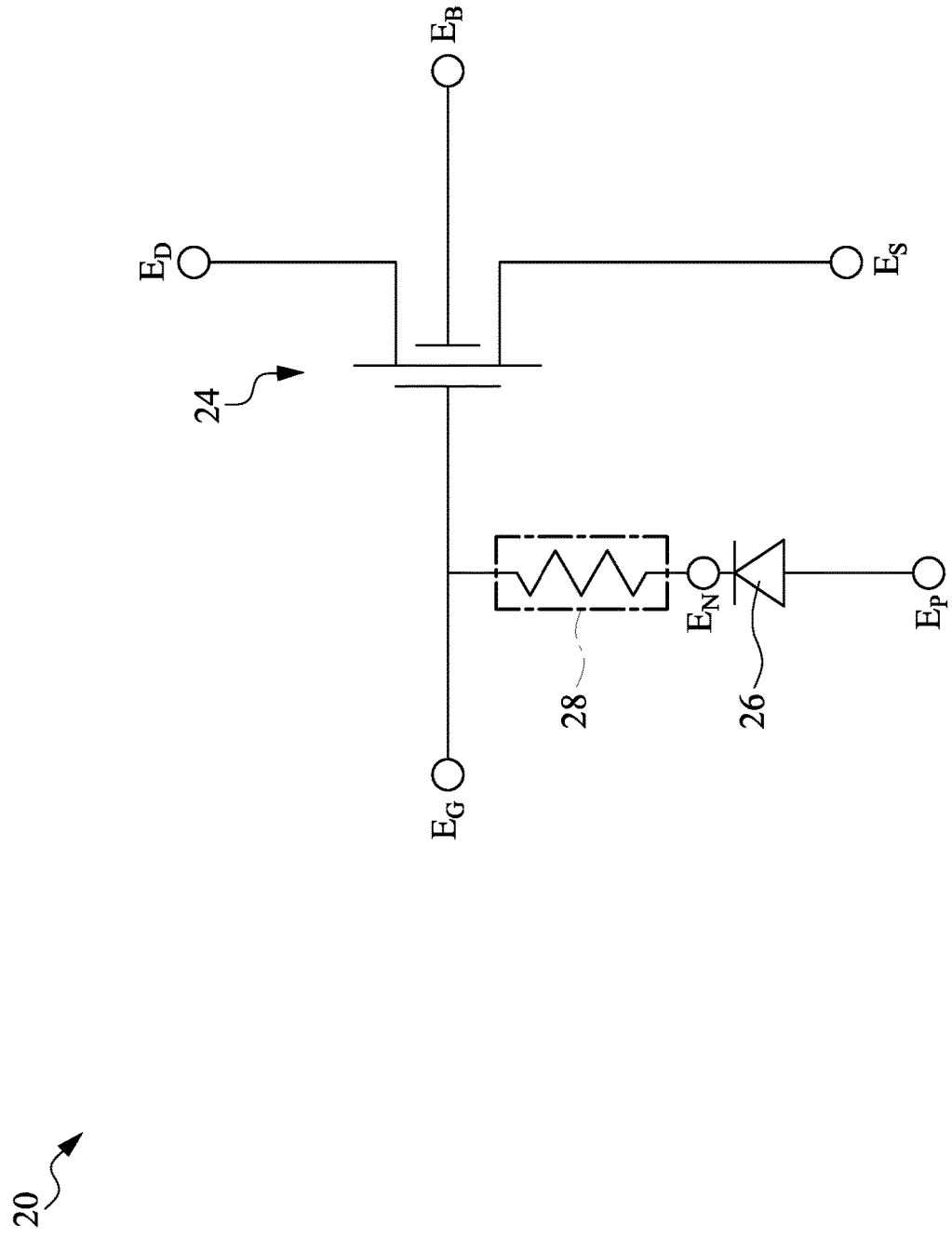
FIG. 3 is a circuit diagram of a benchmark device, in accordance with some embodiments of the present disclosure.

FIG. 3 illustrates a circuit diagram of a benchmark device, in accordance with some embodiments of the present disclosure. FIG. 3 shows a circuit diagram of a benchmark device 20. The benchmark device 20 includes a transistor 24, a diode 26, and a disconnecting switch 28.

The transistor 24 includes conductive contacts $E_D$, $E_S$, $E_G$, and $E_B$. The conductive contact $E_D$ can also be referred to as the drain electrode of the transistor 24. The conductive contact $E_S$ can also be referred to as the source electrode of the transistor 24. The conductive contact $E_G$ can also be referred to as the gate electrode of the transistor 24. The conductive contact $E_B$ can also be referred to as the bulk electrode of the transistor 24.

The diode 26 includes conductive contacts $E_P$ and $E_N$. The conductive contacts $E_N$ and $E_P$ can respectively be referred to as a cathode electrode and an anode electrode of the diode 26.

The disconnecting switch 28 is electrically connected to the conductive contacts $E_G$ and $E_N$.

The benchmark device 20 includes one basic component (e.g., the transistor 24) utilized to constitute the circuits within a die (e.g., die 12 of FIG. 1A). Therefore, the characteristics/performance of the circuits within the die can be evaluated after the characteristics/performance of the basic component is obtained.

The benchmark device 20 can be used to monitor the characteristics of a die (e.g., die 12 of FIG. 1A) during a wafer acceptance test (WAT). The benchmark device 20 can be formed in a scribe line or a street on a wafer (e.g., wafer 10 of FIG. 1A).

The diode 26, which can be referred to as an antenna diode, is electrically connected to the transistor 24 through the disconnecting switch 28. The diode 26 is configured to create a route for discharge, so as to prevent undesired damages caused by antenna effects during manufacture (e.g., etching) of a wafer.

Although the diode 26 is useful to protect the semiconductor device during manufacture, it nevertheless disturbs the measurements on the transistor 24 that need to be conducted after manufacture is completed.

The disconnecting switch 28, electrically connected between the transistor 24 and the diode 26, can be operable to disconnect the diode 26 from the transistor 24 when appropriate. The operations associated with the benchmark device 20, including triggering the disconnecting switch 28 into an open circuit status, and conducting measurements on the transistor 24, will be further discussed in accordance with FIGS. 5A and 5B.

Figure 4A:
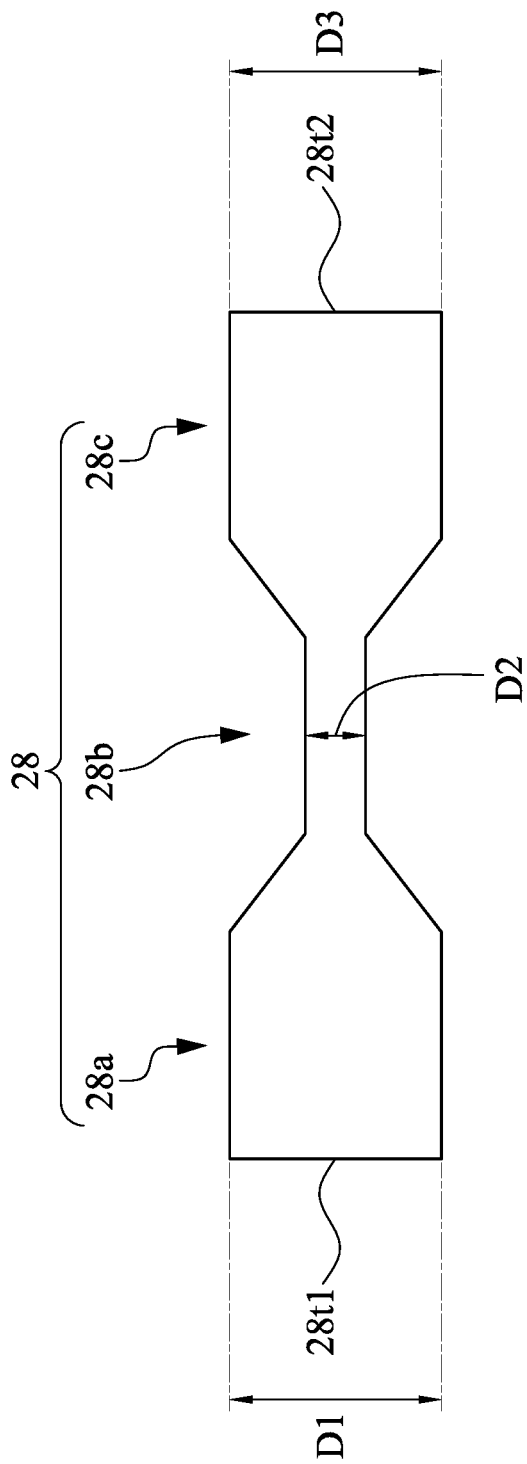
FIGS. 4A and 4B are schematic views of a disconnecting switch, in accordance with some embodiments of the present disclosure.
Figure 4B:
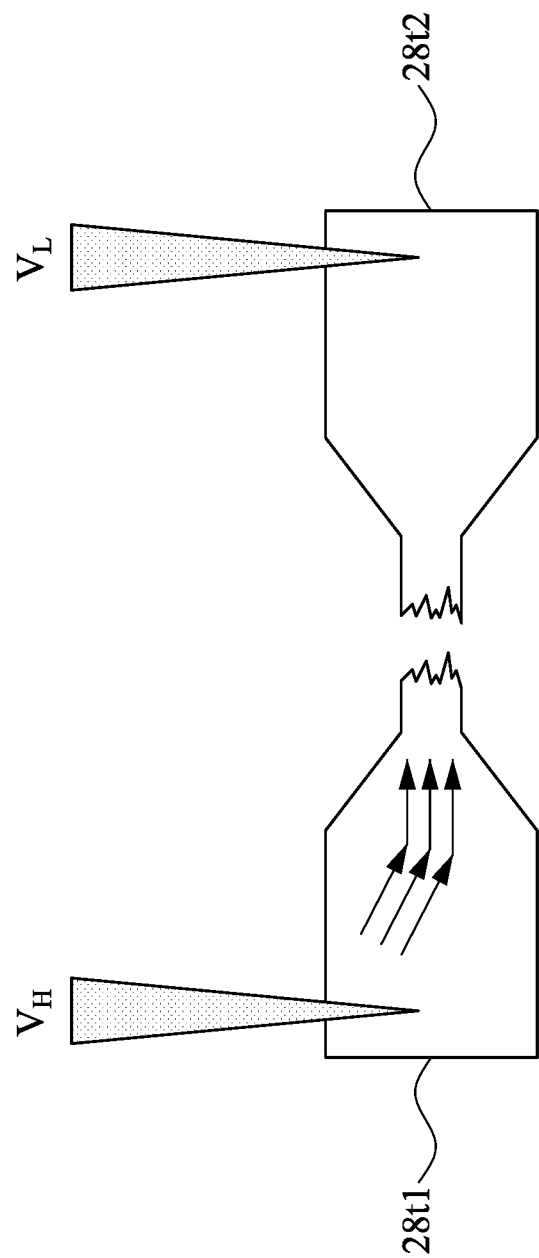

FIGS. 4A and 4B each illustrates a schematic view of a disconnecting switch, in accordance with some embodiments of the present disclosure.

FIG. 4A shows a schematic view of the disconnecting switch 28. The disconnecting switch 28 includes terminals 28t1 and 28t2. The terminals 28t1 and 28t2 can respectively connected to the transistor 24 and the diode 26. The disconnecting switch 28 includes portions 28a, 28b, and 28c. The portion 28a can have a dimension D1. The portion 28b can have a dimension D2. The portion 28c can have a dimension D3.

The dimension D1 can be different than the dimension D2. The dimension D2 can be different than the dimension D3. In some embodiments, the dimension D1 can be substantially identical to the dimension D3.

The dimension D1 exceeds the dimension D2. The dimension D3 exceeds the dimension D2. In some embodiments, the portion 28b can also be referred to as a fuse element of the disconnecting switch 28.

In some embodiments, the dimensions D1, D2 and D3 can be measured from the cross-section of the disconnecting switch 28. The portion 28a can have a resistance different from that of the portion 28b. The portion 28a can have a resistance less than that of the portion 28b. The portion 28c can have a resistance different from that of the portion 28b. The portion 28c can have a resistance less than that of the portion 28b. In some embodiments, the portion 28a can have a resistance substantially identical to that of the portion 28c.

In some embodiments, a ratio between the dimensions D1 and D2 can range from 1 to 5. In some embodiments, a ratio between the dimensions D1 and D2 can range from 1 to 10. In some embodiments, a ratio between the dimensions D1 and D2 can range from 1 to 20. In some embodiments, a ratio between the dimensions D1 and D2 can range from 1 to 40.

Referring to FIG. 4B, when a relatively higher voltage $V_H$ is applied to the terminal 28t1 and a relatively lower voltage $V_L$ is applied to the terminal 28t2, the portion 28b will be blown out due to current crowding, and then an open circuit will be formed between the terminals 28t1 and 28t2.

Figure 5A:
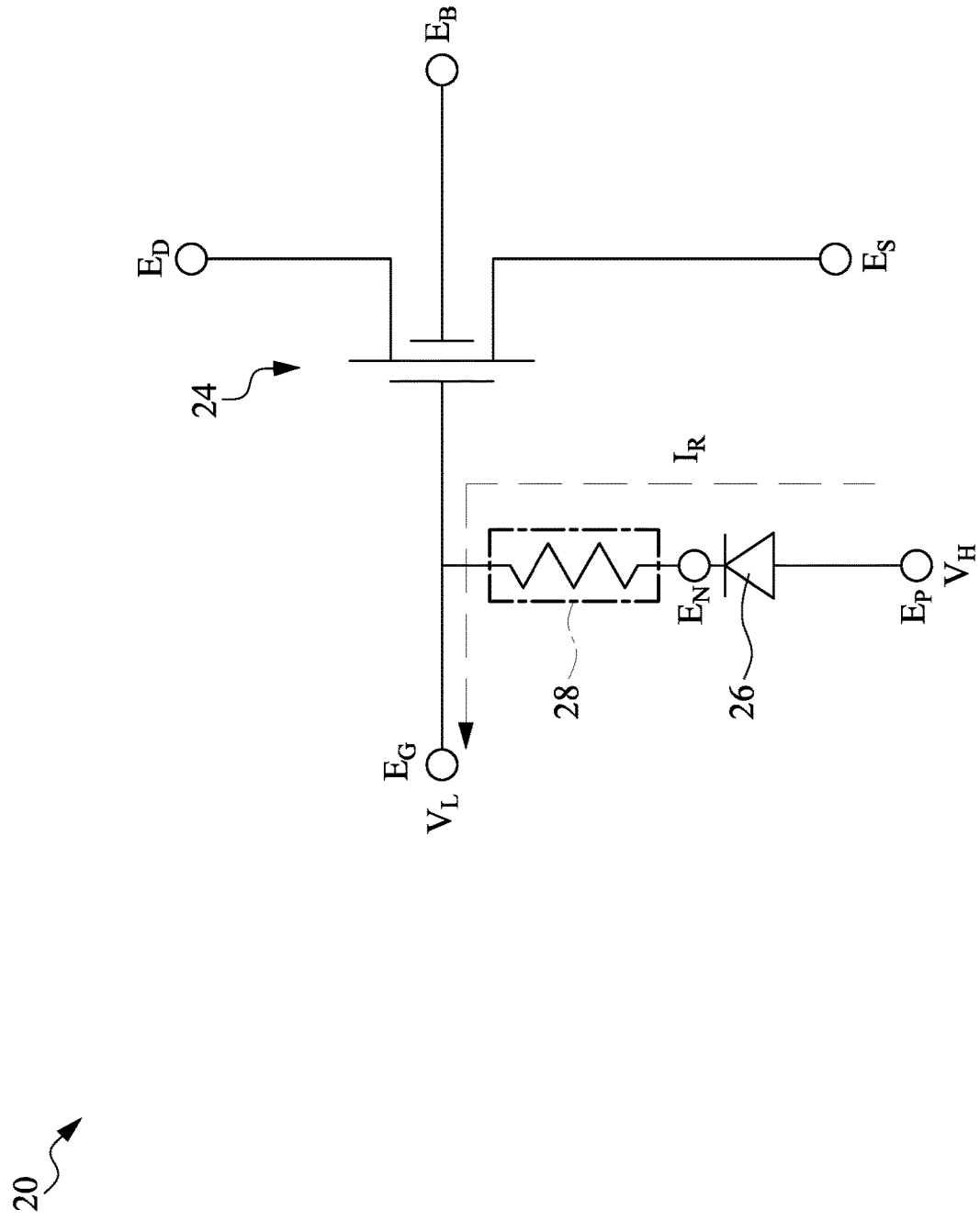
FIG. 5A illustrates one stage of a method of operating a benchmark device, in accordance with some embodiments of the present disclosure.

FIG. 5A illustrates one stage of a method of operating a benchmark device, in accordance with some embodiments of the present disclosure. FIG. 5A shows a benchmark device 20 before one specific manufacturing process (e.g., etching) is completed. In this stage, the disconnecting switch 28 connects conductive contacts $E_G$ and $E_P$, and forms a short circuit therebetween. In this stage, a conductive path is formed between the transistor 24 and the diode 26 by the disconnecting switch 28.

In order to trigger the disconnecting switch 28 into an open circuit status, a relatively lower voltage $V_L$ is applied to the conductive contact $E_G$, and a relatively higher voltage $V_H$ is applied to the conductive contact $E_P$. The voltages $V_H$ and $V_L$ are selected such that the diode 26 can be turned on. When the diode 26 is turned on, a current $I_R$ will flow through the disconnecting switch 28, from the conductive contact $E_P$ to the conductive contact E.

The current $I_R$ is configured to exceed a predetermined value. The current $I_R$ is configured to exceed the breaking capacity of the disconnecting switch 28, and triggers the disconnecting switch 28 into an open circuit status. In some embodiments, the current $I_R$ can blow out the fuse element within the disconnecting switch 28, and therefore an open circuit can be formed.

The operation of triggering the disconnecting switch 28 into an open circuit status can be performed, for example, by the system 100 of FIG. 1A. The voltages $V_H$ and $V_L$ can be generated by, for example, the signal generator 104 and then applied to the conductive contacts $E_G$ and $E_P$ through the probes 110.

Figure 5B:
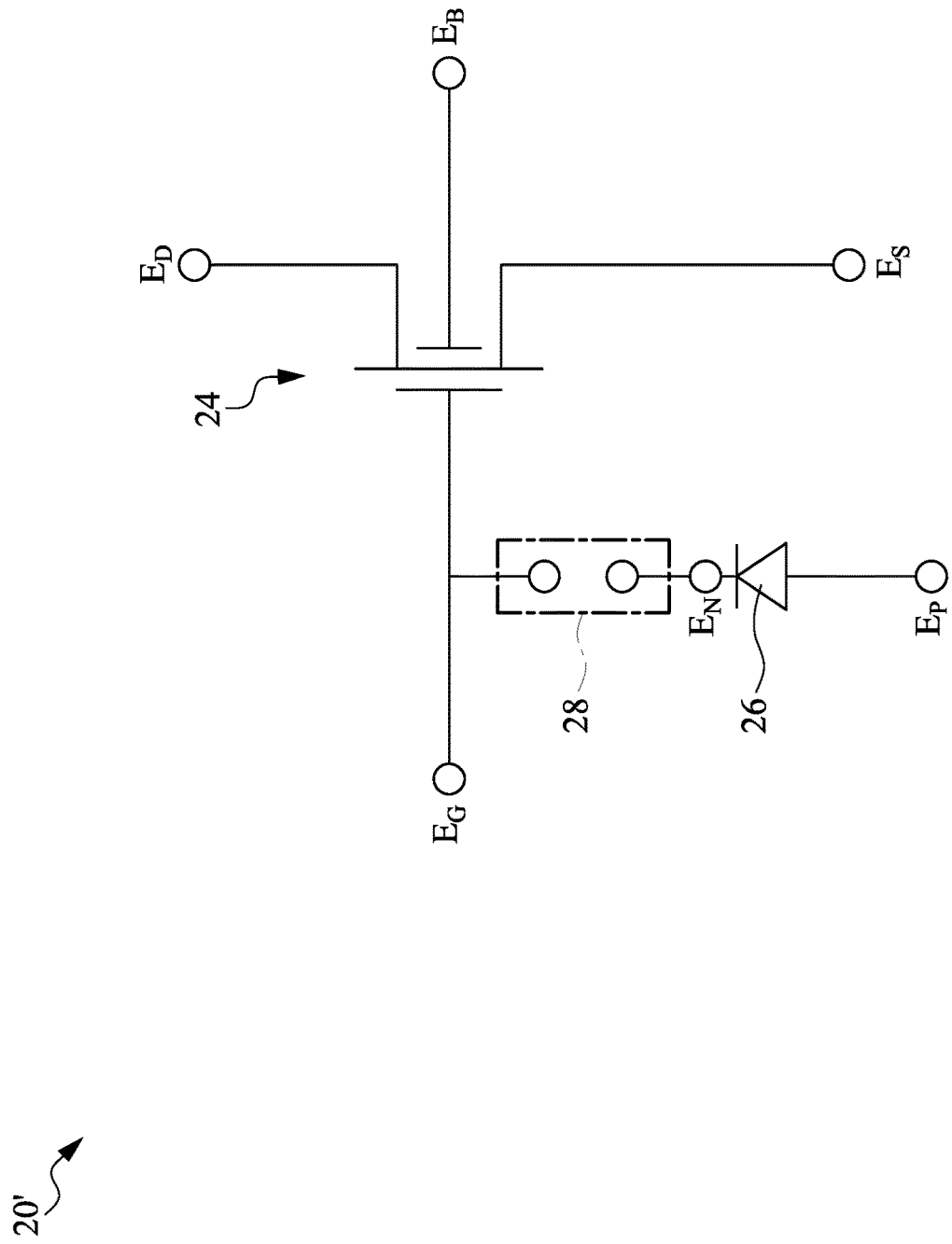
FIG. 5B illustrates one stage of a method of operating a benchmark device, in accordance with some embodiments of the present disclosure.

FIG. 5B illustrates one stage of a method of operating a benchmark device, in accordance with some embodiments of the present disclosure. FIG. 5B shows a benchmark device 20'. The benchmark device 20' is similar to the benchmark device 20 of FIG. 5A, differing therefrom in that the disconnecting switch 28 exhibits an open circuit status. That is, the transistor 24 is electrically isolated from the diode 26, by the disconnecting switch 28.

In the stage shown in FIG. 5B, measurements on the transistor 24 can be conducted without the interference introduced by the diode 26. The measurements on the transistor 24 can be performed, for example, by the system 100 of FIG. 1A. Signals, voltage, or current generated by, for example, the signal generator 104, can be applied to the conductive contacts $E_G$, $E_D$, $E_S$, and $E_B$, through the probes 110. The benchmark device 20', with the diode 26 disconnected, can be used to accurately monitor the characteristics of a die (e.g., die 12 of FIG. 1A) during a wafer acceptance test (WAT).

Figure 6:
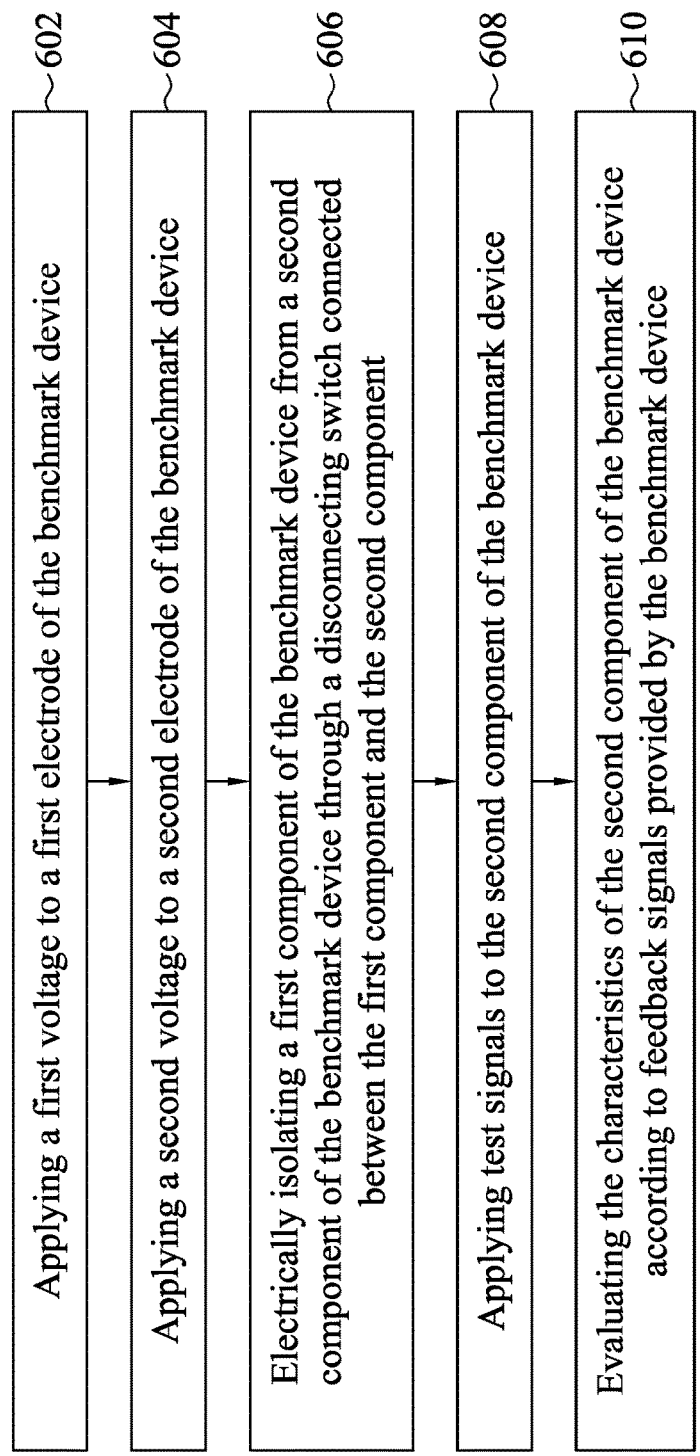
FIG. 6 illustrates a method of operating a benchmark device, in accordance with some embodiments of the present disclosure.

FIG. 6 illustrates a method of operating a benchmark device, in accordance with some embodiments of the present disclosure. FIG. 6 shows a method 600 of operating a benchmark device. The method 600 includes operations 602, 604, 606, 608, and 610.

In operation 602, a first voltage is applied/provided to a first electrode of a benchmark device. In some embodiments, a relatively higher voltage $V_H$, generated by the signal generator 104, can be applied/provided to the conductive contact $E_P$ of the benchmark device 20.

In operation 604, a second voltage is applied/provided to a second electrode of the benchmark device. In some embodiments, a relatively lower voltage $V_L$, generated by the signal generator 104, can be applied/provided to the conductive contact $E_G$ of the benchmark device 20.

In operation 606, a first component of the benchmark device is electrically isolated from a second component of the benchmark device utilizing a disconnecting switch. In some embodiments, after the voltages $V_H$ and $V_L$ are applied, the diode 26 of the benchmark device 20 can be electrically disconnected from the transistor 24 of the benchmark device 20, through the disconnecting switch 28. Referring to FIG. 5A, the fuse element within the disconnecting switch 28 can be blown out by the current $I_R$ after voltages $V_H$ and $V_L$ are applied. An open circuit can then be formed between the conductive contacts $E_N$ and $E_G$.

In operation 608, test signals are applied to the second component of the benchmark device. In some embodiments, referring to FIG. 5B, test signals, including but not limited to, voltage, current, analog signals, digital signals, and/or commands, generated by the signal generator 104 can be applied to the benchmark device 20'. Test signals can be applied to one or more conductive contacts of the benchmark device 20'.

In operation 610, characteristics of the second component of the benchmark device can be evaluated according to feedback signals provided by the benchmark device. In some embodiments, the feedback signals provided by the benchmark device 20' can be received, for example, by the system 100. The feedback signals provided by the benchmark device 20' can then be calculated, processed, or analyzed by the processor 102 so as to obtain the characteristics of the transistor 24.

Figure 7:
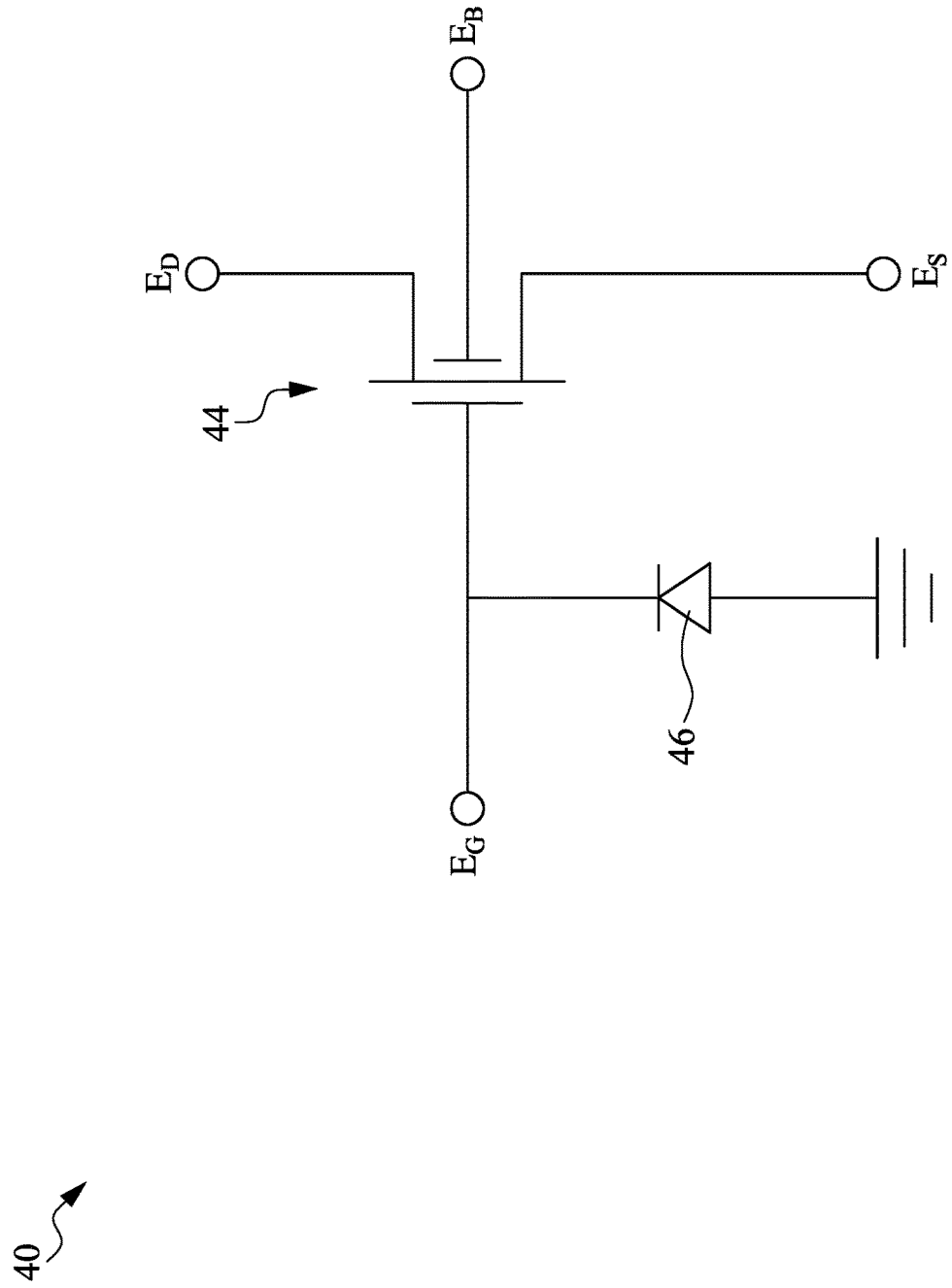
FIG. 7 is a schematic view of a benchmark device, in accordance with some comparative embodiments of the present disclosure.

FIG. 7 illustrates a schematic view of a benchmark device, in accordance with some comparative embodiments of the present disclosure. FIG. 7 shows a benchmark device 40. The benchmark device 40 includes a transistor 44 and a diode 46. The transistor 44 includes conductive contacts $E_G$, $E_D$, $E_B$, and $E_S$. The cathode electrode of the diode 46 is electrically connected to the conductive contact $E_G$ of the transistor 44.

While the diode 46 is useful to protect the benchmark device 40 during manufacture, it nevertheless disturbs the measurements on the benchmark device 40 that need to be conducted. In some embodiments, FIB (focused ion beam) is utilized to destroy the electrical connection between the diode 46 and the transistor 44. However, FIB may cause unwanted damages to the benchmark device 40 if the FIB system is not well-controlled.

One aspect of the present disclosure provides a semiconductor wafer comprising a benchmark device disposed within a scribe line of the semiconductor wafer. The benchmark device includes a transistor, a diode, and a disconnecting switch electrically connected to the transistor and the diode. The disconnecting switch is configured to form a conductive path between the transistor and the diode at a first stage, and to electrically isolate the transistor from the diode at a second stage.

Another aspect of the present disclosure provides a benchmark device embedded on a semiconductor wafer. The benchmark device includes a transistor comprising a gate electrode, a diode comprising a cathode electrode, and a disconnecting switch electrically connected between the gate electrode of the transistor and the cathode electrode of the diode. The disconnecting switch is configured to electrically disconnect the gate electrode of the transistor from the cathode electrode of the diode in response to a current exceeding a predetermined value through the disconnecting switch.

Another aspect of the present disclosure provides a method of operating a benchmark device embedded on a semiconductor wafer. The method includes applying a first voltage to a first electrode of the benchmark device, and applying a second voltage to a second electrode of the benchmark device. The method further includes electrically isolating a first component of the benchmark device from a second component of the benchmark device through a disconnecting switch connected between the first component and the second component.

The disconnecting switch disclosed in the present disclosure can be configured to disconnect a specific component (e.g., the antenna diode) from the benchmark device after the manufacture of a semiconductor device is complete. The disconnecting switch disclosed in the present disclosure can facilitate the measurements on the benchmark device by eliminating the interference introduced by a specific component (e.g., the antenna diode). Furthermore, with the disconnecting switch disclosed in the present disclosure, unwanted damages to the semiconductor device caused by FIB (focused ion beam) can be prevented.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of operating a benchmark device embedded on a semiconductor wafer, the method comprising:
    forming a diode on the substrate, wherein the diode has a first doped region, a second doped region, and a first diode conductive contact disposed on the first doped region, and a second diode conductive contact disposed on the second doped region, wherein the first doped region includes a N-type dopant and the second doped region includes a P-type dopant;
    forming a transistor on substrate, wherein the transistor has a gate conductor;
    electrically connecting a first component to the gate conductor through a first conductive contact;
    electrically connecting a second component to the first doped region through the first diode conductive contact, wherein the first diode conductive contact serves as a cathode of the diode;
    electrically connecting a third component to the second doped region through the second diode conductive contact;
    electrically connecting a disconnecting switch between the first component and the second component;
    applying a first voltage to a first electrode, wherein the first electrode is disposed on the third component and serves as an anode of the diode;
    applying a second voltage to a second electrode, wherein the second electrode is disposed on the first component and serves as a gate electrode of the transistor, wherein the first voltage and the second voltage are configured to produce a current through the disconnecting switch from the first electrode to the second electrode along the third component, the second component and the first component; and
    electrically isolating the first component from the second component through the disconnecting switch when the current exceeds a breaking capacity of the disconnecting switch.

2. The method of claim 1, wherein the first voltage is higher than the second voltage.

3. The method of claim 2, wherein the transistor further has a source region, a drain region, a first transistor conductive contact disposed on the source region, a second transistor conductive contact disposed on the drain region, and a bulk electrode, wherein the gate conductor is positioned between the source region and the drain region.

4. The method of claim 3, further comprising:
    applying test signals to the second component via one or more of the first transistor conductive contact, the second transistor conductive contact, the bulk electrode, and the second electrode of the transistor; and
    evaluating the characteristics of the second component according to feedback signals so as to obtain the characteristics of the second component.

5. The method of claim 4, wherein the disconnecting switch connects the second electrode and the first electrode.

6. The method of claim 5, wherein the disconnecting switch comprises a first portion, a second portion, a third portion, a first terminal provided at the first portion to electrically connect to the transistor through the first component, and a second terminal provided at the third portion to electrically connect to the diode through the second component, wherein the second portion is positioned between the first portion and the third portion, and a first dimension of the first portion is different from a second dimension of the second portion, such that the second portion of the disconnecting switch is blown out when the current exceeds the breaking capacity of the disconnecting switch.

7. The method of claim 6, wherein the disconnecting switch is made of zinc, copper, silver, or aluminum.

* * * * *